(12) United States Patent
Hirota et al.

(10) Patent No.: US 6,329,740 B1
(45) Date of Patent: Dec. 11, 2001

(54) PIEZOELECTRIC/ELECTROSTRICTIVE DEVICE AND PRODUCTION METHOD THEREOF

(75) Inventors: Toshikazu Hirota, Kuwana; Koji Kimura, Nagoya; Yukihisa Takeuchi, Aichi-Prefecture, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/413,127

(22) Filed: Oct. 6, 1999

Related U.S. Application Data

(63) Continuation-in-part of application No. 09/242,642, filed on Dec. 28, 1998, now Pat. No. 6,239,534.

(51) Int. Cl.[7] .................................................. H01L 41/08
(52) U.S. Cl. ................ 310/328; 310/323.01; 310/323.17; 310/330; 310/368
(58) Field of Search ..................... 310/323.01, 323.17, 310/328, 330, 367, 368

(56) References Cited

U.S. PATENT DOCUMENTS

| | | | | |
|---|---|---|---|---|
| 2,980,811 | * | 4/1961 | Jacque | 310/328 |
| 3,109,973 | * | 11/1963 | Harris | 310/328 |
| 4,019,073 | * | 4/1977 | Vishnevsky et al. | 310/328 |
| 4,523,120 | * | 6/1985 | Assard et al. | 310/323.1 |
| 4,742,260 | * | 5/1988 | Shimizu et al. | 310/323.01 |
| 5,739,532 | * | 4/1998 | Imada et al. | 250/338.2 |
| 6,109,104 | * | 8/2000 | Fukuda et al. | 73/504.13 |
| 6,140,739 | * | 10/2000 | Arai et al. | 310/321 |

FOREIGN PATENT DOCUMENTS

| | | | | |
|---|---|---|---|---|
| 0 606 767 A1 | * | 7/1994 | (EP) | 310/328 |
| 50-67492 | * | 6/1975 | (JP) | 310/358 |
| 61-233334 | * | 10/1986 | (JP) | 310/328 |
| 10-136665 | | 5/1998 | (JP) | H02N/2/00 |

OTHER PUBLICATIONS

Yoshikazu Soeno et al., "Piezoelectric Piggy–Back Microactuator for Hard Disk Drive," IEEE Transactions on Magnetics, vol. 35, No. 2, Mar. 1999, pp. 983–987.

S. Koganezawa et al., "Dual–Stage Actuator System for Magnetic Disk Drives Using a Shear Mode Piezoelectric Microactuator," IEEE Transactions on Magnetics, vol. 35, No. 2, Mar. 1999, pp. 989–993.

* cited by examiner

Primary Examiner—Thomas M. Dougherty
(74) Attorney, Agent, or Firm—Burr & Brown

(57) ABSTRACT

A piezoelectric/electrostrictive device includes: a driving portion which is driven by displacement of a piezo-electric/electrostrictive element, a movable portion which operates on the basis of a drive of the driving portion, and a fixed portion for supporting the above driving portion and movable portion. It has a driving portion including thin plates facing each other and a thin film piezoelectric/electrostrictive element formed on the surface of at least one of the thin plates, and the above fixed portion and the above movable portion are joined by the driving portion. In this piezoelectric/electrostrictive element, the movable portion can largely be displaced, and it is not easily affected by a harmful vibration in operation, and it is excellent in mechanical strength, handling efficiency, impact resistance, and moisture resistance.

15 Claims, 18 Drawing Sheets

FIG. 5(a)
FIG. 5(b)
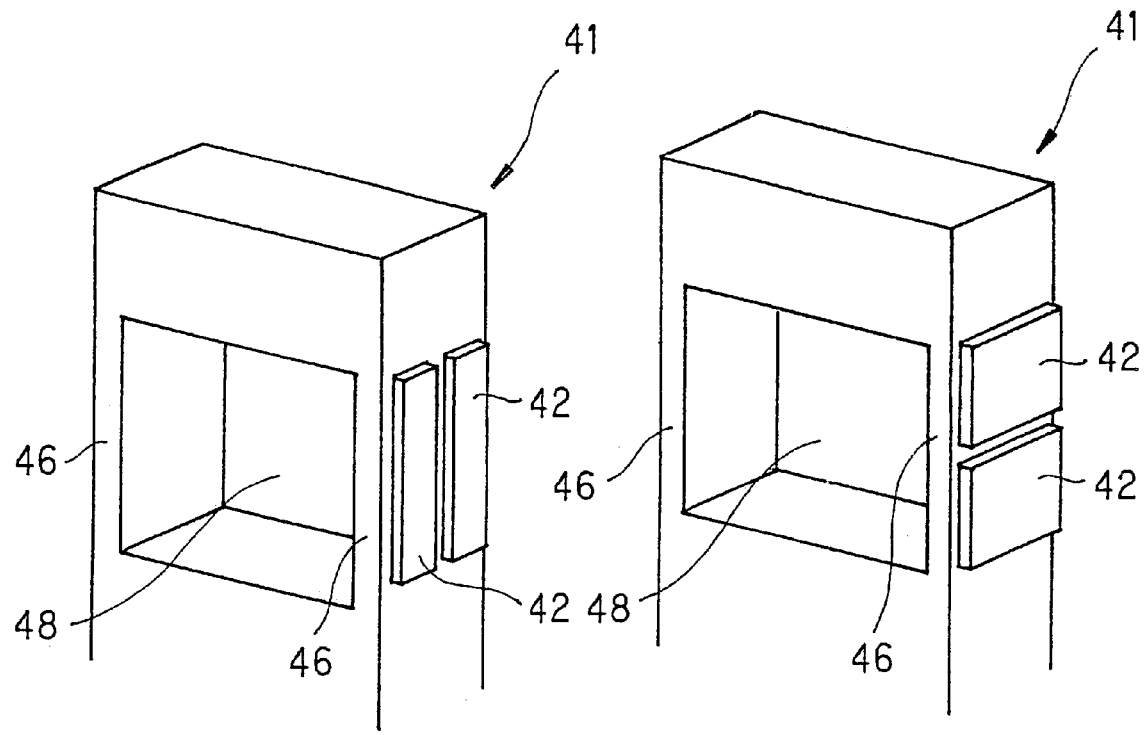
FIG. 5(c)
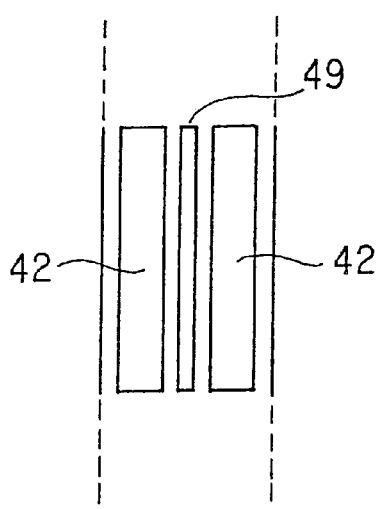
FIG. 5(d)
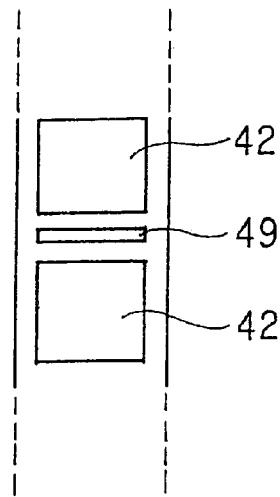

FIG. 16(a)
FIG. 16(b)
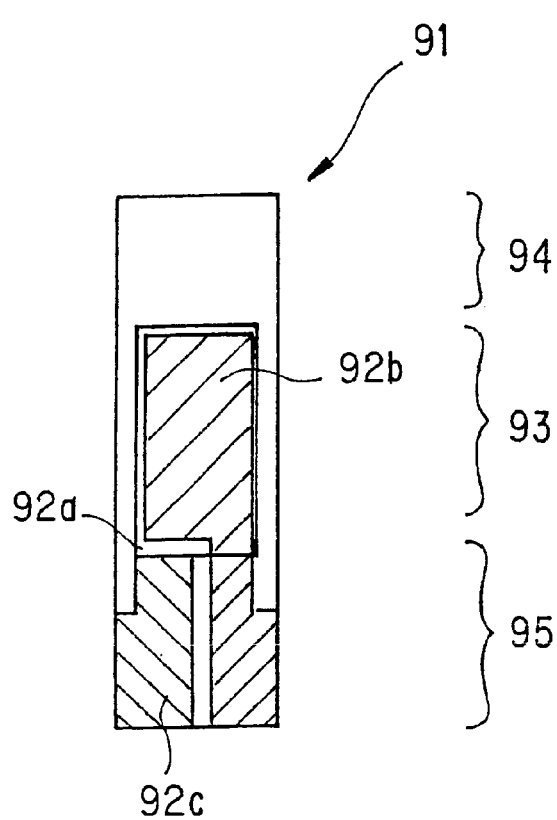
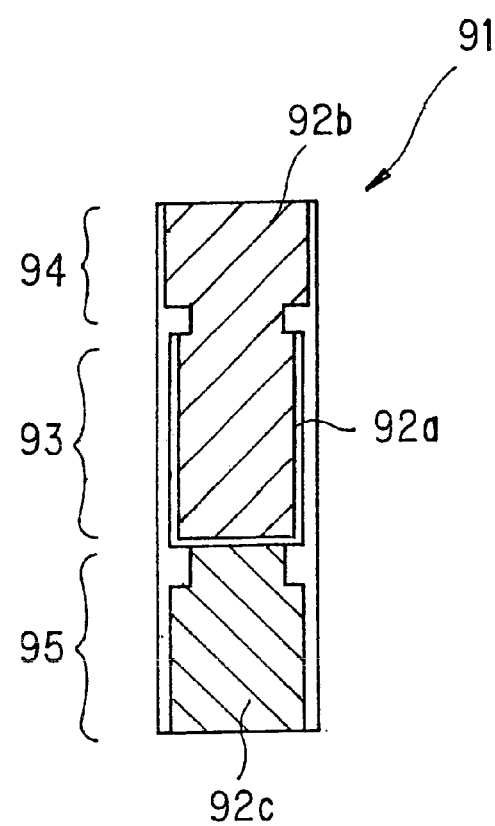

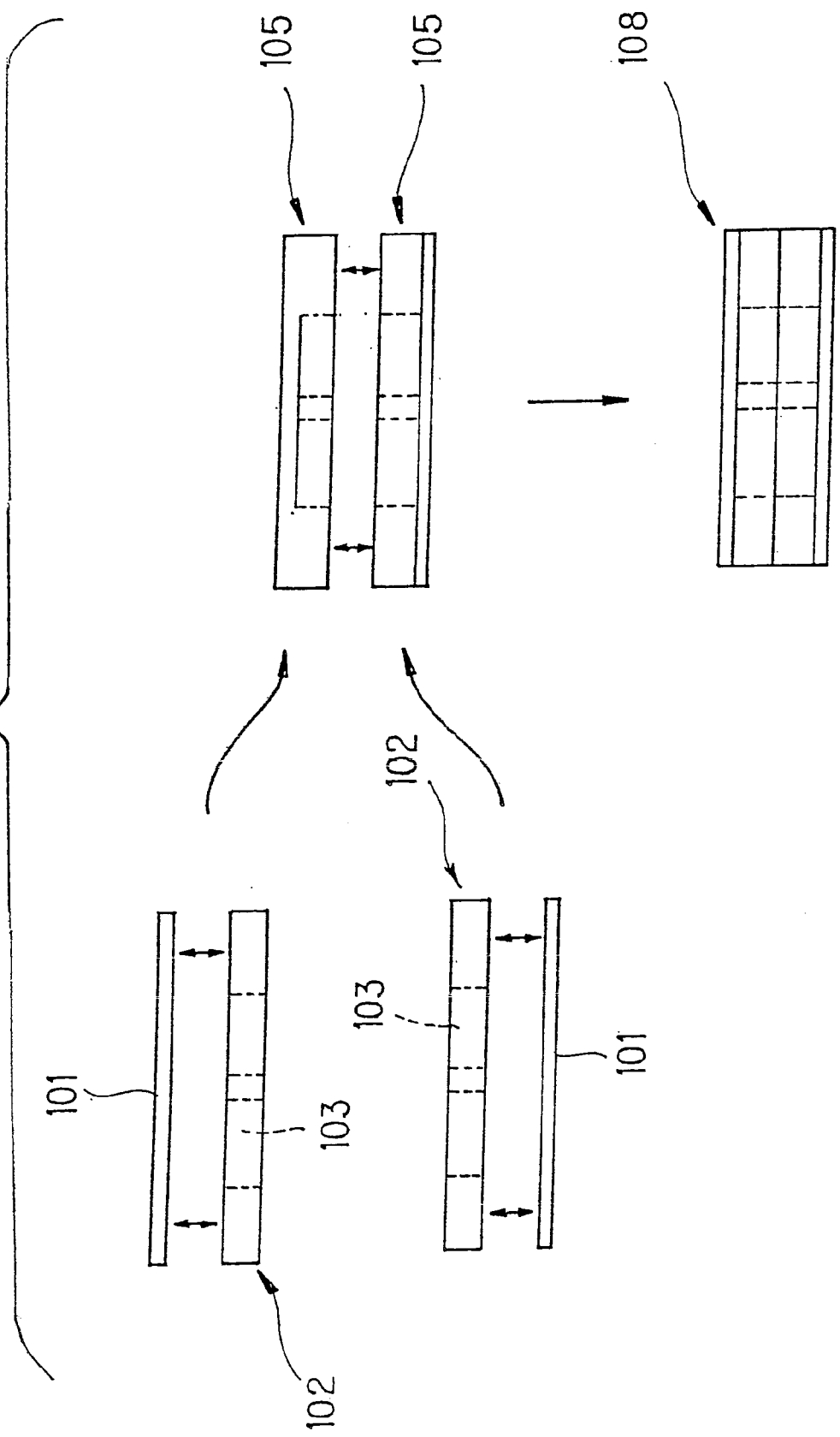

FIG. 21(a)
FIG. 21(c)
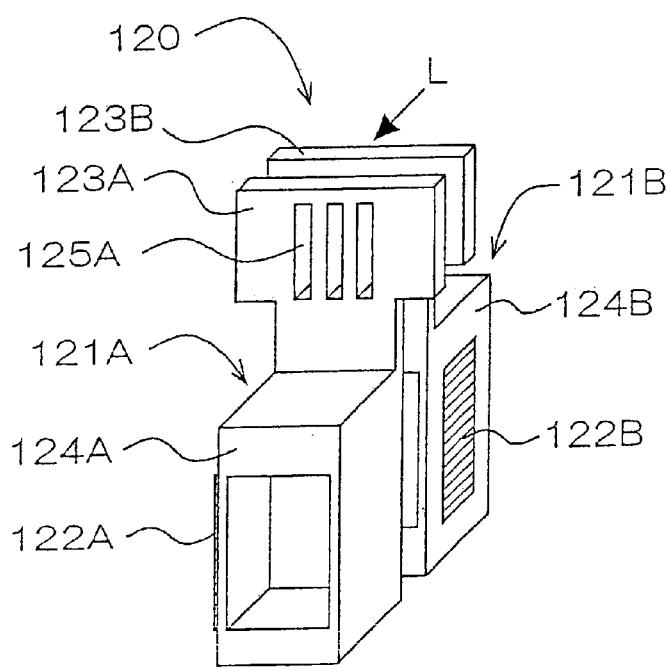
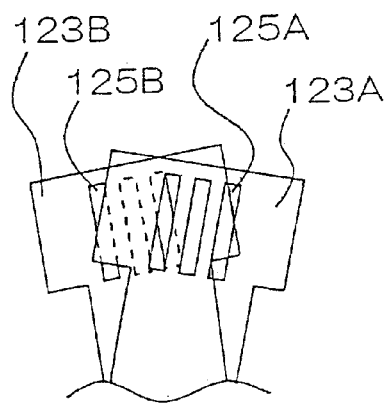
FIG. 21(b)
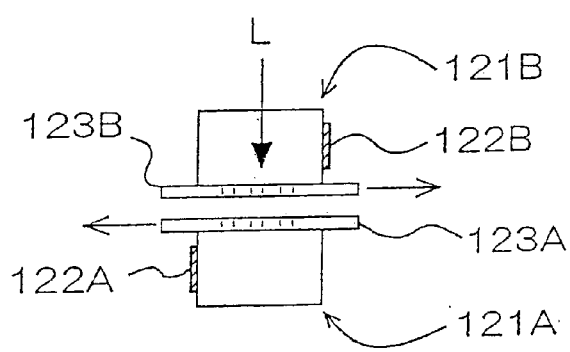

PIEZOELECTRIC/ELECTROSTRICTIVE DEVICE AND PRODUCTION METHOD THEREOF

Cross Reference to Related Application

This application is a continuation-in-part application of U.S. application Ser. No. 09/242,642, filed Dec. 28, 1998, now U.S. Pat. 6,239,534, the entirety of which is incorporated herein by reference.

BACKGROUND OF THE INVENTION AND RELATED ART STATEMENT

The present invention relates to a piezoelectric/electrostrictive device having a movable portion which operates on the basis of displacement of a piezoelectric/electrostrictive element, or a piezoelectric/electrostrictive device which can detect displacement of a movable portion by a piezoelectric/electrostrictive element, and particularly relates to a piezoelectric/electrostrictive device which is excellent in strength, impact resistance, and moisture resistance and has a high amplitude efficiency and can largely operate the movable portion.

Recently, in the fields of optical and magnetic recording, precisionmachining or the like, a displacement element which can adjust an optical path length or a position in sub-micron precision has been required, and the development of a displacement element which uses displacement based on the inverse piezoelectric effect or electrostrictive effect caused when voltage is applied to a piezoelectric/electrostrictive material (for example, a ferroelectric substance) has been progressed.

For example, as shown in FIG. 2, a piezoelectric actuator 21 is disclosed in Japanese Patent Laid-Open No. 10-136665, in which a fixed portion 25, a movable portion 24, and a beam portion 26 for connecting these portions are unitarily formed by providing a hole portion 28 in a plate-like substance made of a piezo electric/electrostrictive material and further, an electrode layer 22 is provided to the beam portion 26.

In the actuator 21, when voltage is applied to the electrode layer 22, the beam portion 26 expands and contracts in the direction of connecting the fixed portion 25 and the movable portion 24 by the inverse piezoelectric effect or electrostrictive effect, and therefore, it is possible to displace the movable portion 24 by arc-like displacement or rotary displacement in the plane of the plate-like substance.

However, in the actuator 21, since displacement in the expanding and contracting direction of a piezoelectric/electro-strictive material (that is, in the direction in the plane of the plate-like substance) is transmitted to the movable portion as it is, displacement of the movable portion 24 is rather small.

Furthermore, in the actuator 21, since all parts are constituted by a piezoelectric/electrostrictive material which is a brittle and relatively heavy material, there has been a problem in that the actuator 21 itself is heavy and it may easily be affected by a harmful vibration in operation (for example, a residual vibration or a noise vibration in high speed operation). In addition, the material has low mechanical strength and is inferior in handling efficiency, impact resistance, and moisture resistance.

In the actuator 21, in order to solve the above problems, it has been proposed to fill the hole portion 28 with a filler having flexibility, but it is clear that the efficiency of displacement based on the inverse piezoelectric effect or electrostrictive effect is lowered in the case of using fillers.

The present invention is made due to such problems of the prior art, and it is an object thereof to provide a displacement element in which a movable portion can largely be operated and is not affected by a harmful vibration in operation, and, additionally, has excellent mechanical strength, handling efficiency, impact resistance, and moisture resistance. As a result, the sensor element can detect a vibration of the movable portion accurately.

SUMMARY OF THE INVENTION

In the present invention, there is provided a piezoelectric/electro-strictive device comprising:

a driving portion which is driven by displacement of a piezoelectric/electrostrictive element;

a movable portion which operates on the basis of a drive of the driving portion; and a fixed portion for supporting said driving portion and movable portion, wherein the device has a driving portion including thin plates facing each other and a thin film piezoelectric/electrostrictive element formed on a surface of at least one of the thin plates and said fixed portion and said movable portion are connected by the driving portion.

As a specific mode of a piezoelectric/electrostrictive device of the present invention, a device can be cited, in which a movable portion and a fixed portion are shaped like a rectangular parallelepiped and thin plates facing each other are spanned so that the sides of the above movable portion and the above fixed portion are continuous.

The piezoelectric/electrostrictive device of the present invention is a device in which a driving portion is driven in the direction perpendicular to the direction of displacement of a piezoelectric/electrostrictive element and a movable portion operates in the plane including the driving direction of the driving portion. Furthermore, it is also possible to use the driving portion for detection of displacement of the movable portion.

Moreover, the piezoelectric/electrostrictive device of the present invention is preferably a device having at least two driving portions, and it is preferably a device in which the width of a thin plate is 5 or more times the thickness of the thin plate.

As a piezoelectric/electrostrictive element constituting a piezoelectric/electrostrictive device of the present invention, it is preferable to use a layered type piezoelectric/electrostrictive element in which a lower electrode, a piezoelectric/electrostrictive film, and an upper electrode are laminated, or a piezoelectric/electrostrictive element which comprises a piezoelectric/electrostrictive film, and a first electrode and a second electrode having a comb-like structure and has a structure where the first electrode and the second electrode are mutually engaged with a gap of a constant width between the mutual comb tooth portions.

In the piezoelectric/electrostrictive device of the present invention, preferably, the movable portion, thin plate, and fixed portion are made of an integrally formed ceramic, and more preferably, the movable portion, thin plate, and fixed portion are made of completely stabilized zirconia or partially stabilized zirconia, and particularly preferably, at least the movable portion, thin plate, and fixed portion are constituted by green sheet layered bodies.

Furthermore, in the piezoelectric/electrostrictive device of the present invention, preferably, the piezoelectric/electrostrictive film constituting a piezoelectric/electrostrictive element is made of a material containing lead zirconate, lead titanite, and lead magnesium niobate as main components, and more preferably, the film is made of a material containing sodium bismuth titanate.

In the present invention, there is further provided a manufacturing method of a piezoelectric/electrostrictive device which has a driving portion including thin plates facing each other and a thin film piezoelectric/electrostrictive element formed on the surface of at least one of the thin plates, and a fixed portion and a movable portion shaped like a rectangular parallelepiped, wherein the thin plates facing each other are spanned so that sides of the movable portion and the fixed portion may be continuous, in which said manufacturing method comprises the steps of: obtaining a unitary layered body by laminating at least one green sheet to be the thin plates, at least one green sheet where at least one hole portion having a rectangular-like shape is formed, and further at least one green sheet to be the thin plates; forming a piezo-electric/electrostrictive element on the surface of the green sheet to be a thin plate by a thick film method or a thin film method; and cutting the layered body in the laminating direction of the green sheets so that the above hole portion having a rectangular-like shape may be open on the side of the layered body after sintering the layered body.

In the present invention, there is further provided a light shutter for controlling penetration and shielding of light by relatively displacing two shielding plates, comprising:
  a piezoelectric/electrostrictive device which comprises:
    a driving portion driven by displacement of a piezoelectric/electro-strictive element;
    a movable portion operating on the basis of a drive of the driving portion; and
    a fixed portion for supporting said driving portion and movable portion, and in which the device has a driving portion including thin plates facing each other and a thin film piezoelectric/electrostrictive element formed on a surface of at least one the thin plates and said fixed portion and said movable portion are connected by the driving portion,
  wherein at least one shielding plate is attached to the movable portion of the piezoelectric/electrostrictive device.

BRIEF DESCRIPTION OF THE DRAWINGS

FIGS. 5 (a) to (d) show still other embodiments of a piezoelectric/electrostrictive device of the present invention, and FIGS. 5 (a) and (b) are schematic perspective illustrations thereof, and FIGS. 5 (c) and (d) are explanatory drawings showing arrangements of a slit.

FIGS. 16 (a) and (b) are schematic explanatory drawings showing another embodiment of the arranging method of an electrode wire of a piezoelectric/electrostrictive device of the present invention.

FIG. 18 is a side view showing an embodiment of a manufacturing method of a piezoelectric/electrostrictive device of the present invention.

FIG. 21 (a), (b), and (c) are schematic explanatory drawings showing another embodiment of a light shutter of the present invention, and FIG. 21 (a) is an illustration, and FIG. 21 (b) is a top view, and FIG. 21 (c) is an enlarged view of a shielding plate.

DETAILED DESCRIPTION OF THE PREFERRED EMBODIMENT

Figure 1:
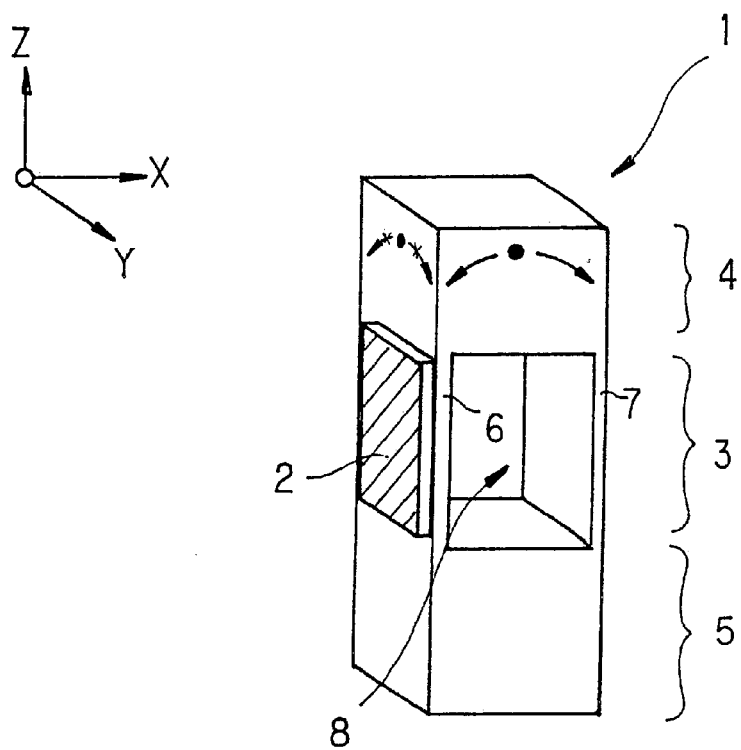
FIG. 1 is a schematic perspective illustration showing one embodiment of a piezoelectric/electrostrictive device of the present invention.
Figure 2:
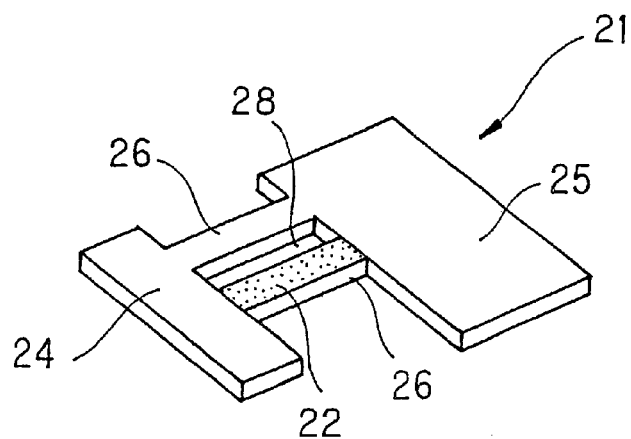
FIG. 2 is a schematic perspective illustration showing one embodiment of a conventional piezoelectric actuator.

A piezoelectric/electrostrictive device of the present invention will be described below by referring to the drawings. However, the present invention is not limited to the illustrated examples.

By the way, in the following description, there are some cases where "piezoelectric" means "piezoelectric and/or electrostrictive." Furthermore, "length" means a distance in the direction of connecting a movable portion and a fixed portion (z-axis direction in the figures), "width" means a distance in the hole portion penetrating direction (y-axis direction in the figures), and "thickness" means a distance in the laminating direction of a piezoelectric element and a thin plate (x-axis direction in the figures).

1. Embodiment of Device

"Piezoelectric/electrostrictive device (hereafter, referred to simply as "device")" used in the present specification is a concept covering elements which mutually convert electric energy and mechanical energy by using a piezoelectric/electrostrictive material. Accordingly, it is preferably used for active elements such as various kinds of actuators or oscillators, especially for displacement elements using displacement based on the inverse piezoelectric effect or electrostrictive effect, and it can also be used as passive elements such as an acceleration sensor element or an impact sensor element.

FIG. 1 is a schematic perspective illustration showing an embodiment of a device 1 of the present invention. The device I is constituted by the respective parts of: a driving portion 3 which is driven by displacement of a piezoelectric element 2; a movable portion 4 which operates on the basis of a drive of the driving portion 3; and a fixed portion 5 which supports the driving portion 3 and the movable portion 4.

The driving portion 3 is constituted by thin plates 6, 7 facing each other and a thin-film-like piezoelectric element 2 formed on the surface of the thin plate 6, and by the thin plates 6, 7, the movable portion 4 and the fixed portion 5 are connected. Accordingly, in the device 1, a hole portion 8 is formed in the direction perpendicular to the facing surfaces of the thin plates 6, 7 facing each other.

Figure 3:
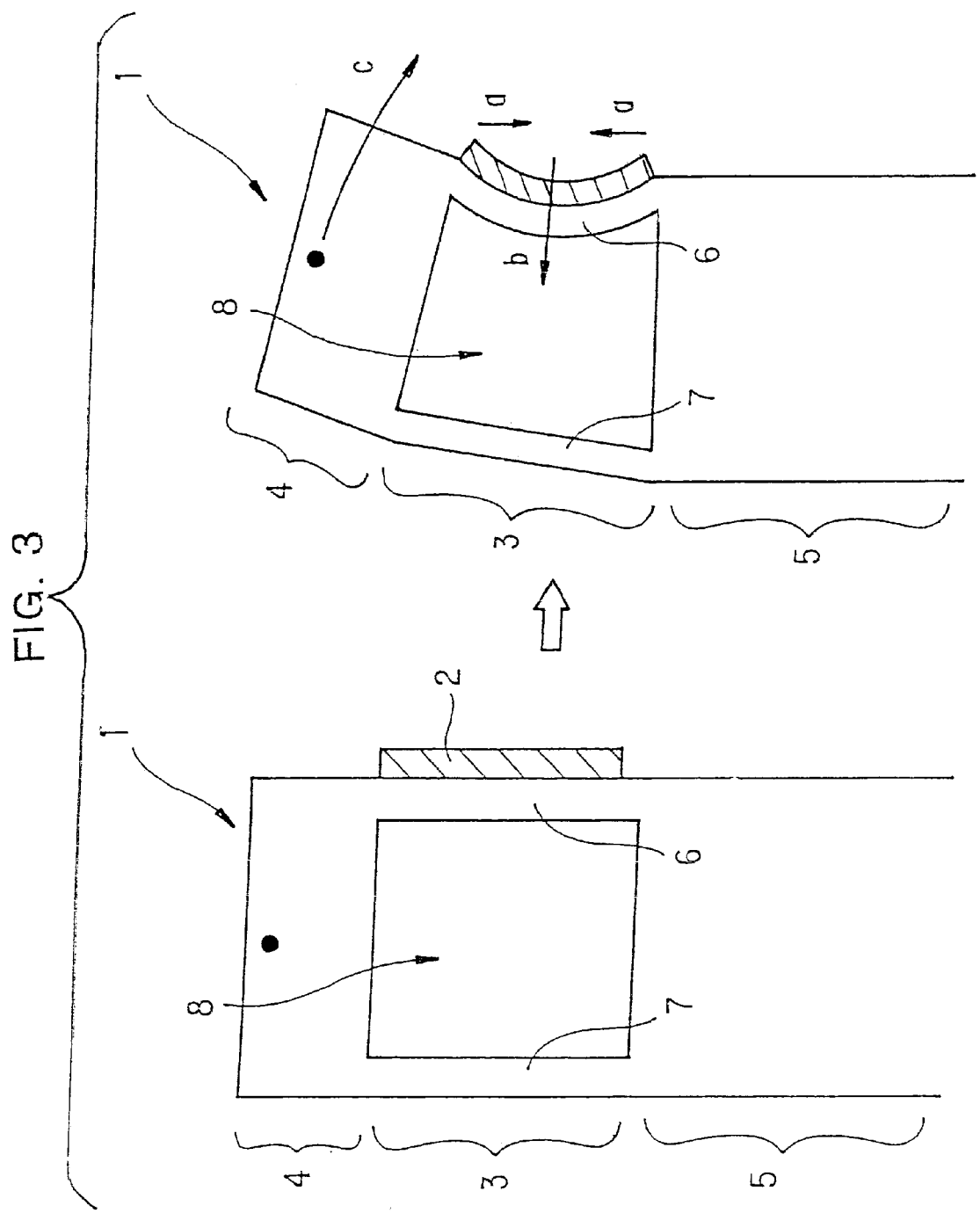
FIG. 3 is a schematic explanatory drawing showing an operating mode of a piezoelectric/electrostrictive device of the present invention.

As shown in FIG. 3, in the device 1, since the piezoelectric element 2 is formed on the surface of the thin plate 6, the driving portion is driven in the direction (b in the figure) perpendicular to the displacing direction (a in the figure) of the piezoelectric element. That is, since minute displacement in the expanding and contracting direction of the piezoelectric element is transmitted to the movable portion 4 after being amplified to a large drive by using a bending of the thin plate 6, it is possible to cause relatively large displacement of the movable portion 4 (c in the figure).

Furthermore, since the device 1 is not a plate-like substance and the movable portion 4 and the fixed portion 5 are shaped like a rectangular parallelepiped and the thin plates 6, 7 are spanned so that the sides of the movable portion 4 and the fixed portion 5 are continuous, it is possible to selectively raise the rigidity in the y-axis direction of the device. That is, in the device 1, it is possible to selectively generate only an arc-like operation of the movable portion 4 in the plane (that is, in the XZ plane) including the driving direction of the driving portion 3, and it is possible to restrain an operation in the YZ plane of the movable portion 4 (operation in the so-called flapping direction).

Figure 4:
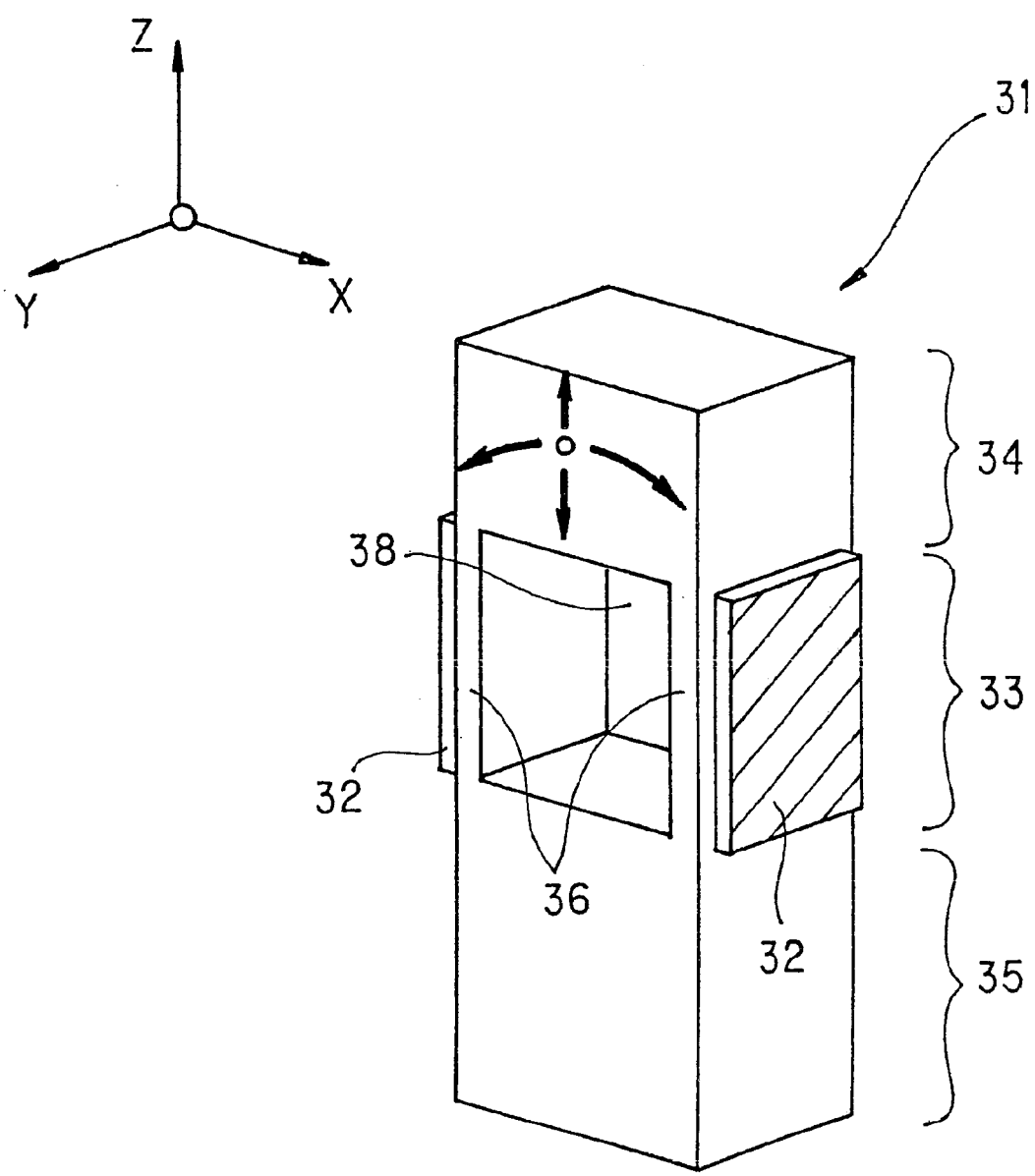
FIG. 4 is a schematic perspective illustration showing another embodiment of a piezoelectric/electrostrictive device of the present invention.

It is sufficient to form a piezoelectric element on the surface of at least one thin plate of the facing thin plates like the device 1, but it is also possible to form piezoelectric elements 32 on both facing thin plates 36 like a device 31 shown in FIG. 4.

In such a constitution, by driving either of piezoelectric elements 32 formed on thin plates 36, 37, it is possible to operate a movable portion 34 in the XZ plane like an arc similarly to the device 1, and further, it is possible to obtain an operation of expanding and contracting the movable portion 34 in the Z-axis direction by synchronously driving both piezoelectric elements 32.

Figure 12:
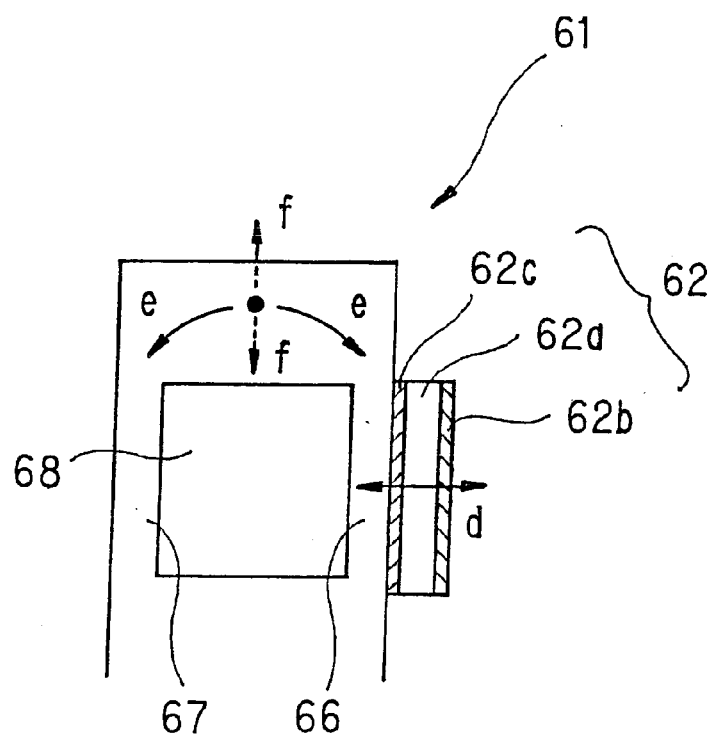
FIG. 12 is a schematic explanatory drawing showing the relation between a piezoelectric element constituting a piezoelectric/electro-strictive device of the present invention and the operating direction.

Furthermore, by separately controlling both the piezoelectric elements 32 to make a difference between the displacement amounts, it is possible to easily obtain an operation in which an arc-like operation in the XZ plane and an operation of expanding and contracting in the Z-axis direction are synthesized. That is, as shown in FIG. 12, in a device 61 of the present invention, the movable portion operates like an arc (e in the figure) in the plane including the driving direction d of a piezoelectric element constituting the driving portion, or it operates to expand and contract (f in the figure), or it operates in the direction in which these are synthesized.

Still further, it is also possible that one of both piezoelectric elements 32 is a driving element and the other is a vibration detecting element. That is, by using the driving portion of a device for detection of displacement of the movable portion, it is possible to make that function as an acceleration sensor or an impact sensor, and the detection of trouble in the driving element becomes possible, and in addition to that, if the voltage applied to the driving element is controlled on the basis of a signal from the detecting element, a more accurate travel control is possible. Furthermore, it is also possible to detect the vibration of the part itself where a piezoelectric/electrostrictive device is arranged and to give an operation with an opposite phase for canceling the vibration to the movable portion and to obtain an effect of restraining the relative vibration of the movable portion as a result.

Furthermore, it is unnecessary to form a piezoelectric element for each thin plate, and it is also possible to form the piezoelectric element by dividing one piece into a plurality of pieces if necessary. For example, in case of being divided in the width direction as shown in FIG. 5 (a), the displacement can be controlled for each separate piezoelectric element, and therefore, displacement in the YZ plane (so-called flapping component) can be restrained, and on the other hand, in case of being divided in the length direction as shown in FIG. 5 (b), bending is easily performed at the divided portion, and therefore, the travel of the movable portion becomes larger and in the meantime, the resolution of the travel can be improved. Furthermore, in case of dividing a piezoelectric element, it is possible that one piezoelectric element is a driving element and the other is a detecting element, and a compact structure, and more accurate detection and control can be attained.

As mentioned above, in case of dividing a piezoelectric element for each thin plate, it is also preferable to provide a slit 49 between the divided piezoelectric elements 42—42 as shown in FIGS. 5 (c) and (d). In such a constitution, the thin plate is easily bent at the slit portion, and therefore, each piezoelectric element 42 can easily displace, and as a result, there is an advantage that displacement of a piezoelectric element 42 can efficiently be transmitted to the movable portion.

Figure 6:
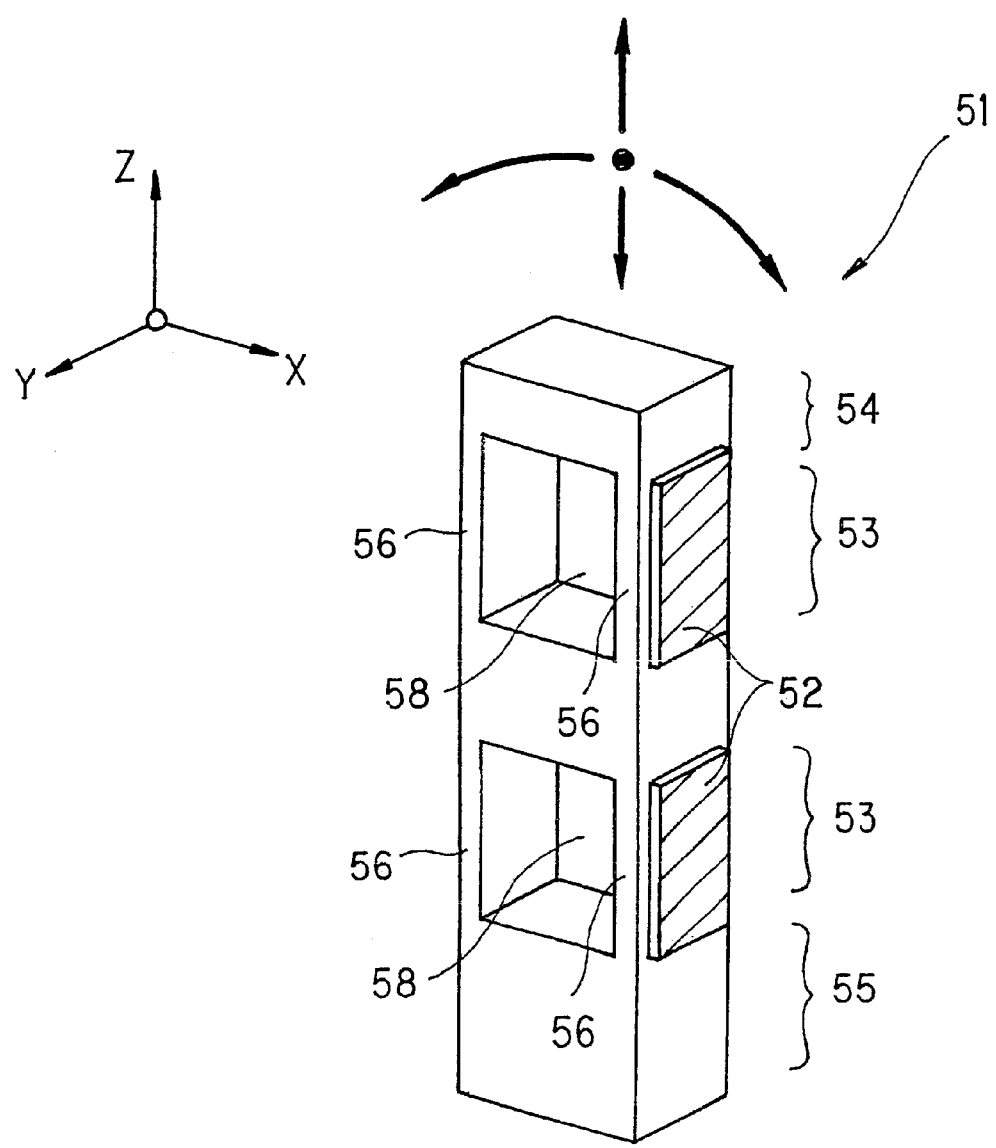
FIG. 6 is a schematic perspective illustration showing still another embodiment of a piezoelectric/electrostrictive device of the present invention.

Furthermore, as shown in FIG. 6, a device 51 having two or more driving portions 53 provided is also preferable. In this case, since the driving amount of each driving portion 53 is synergistically transmitted, it is possible to more largely operate the movable portion 54, when compared with the case where there is only one driving portion.

Figure 7:
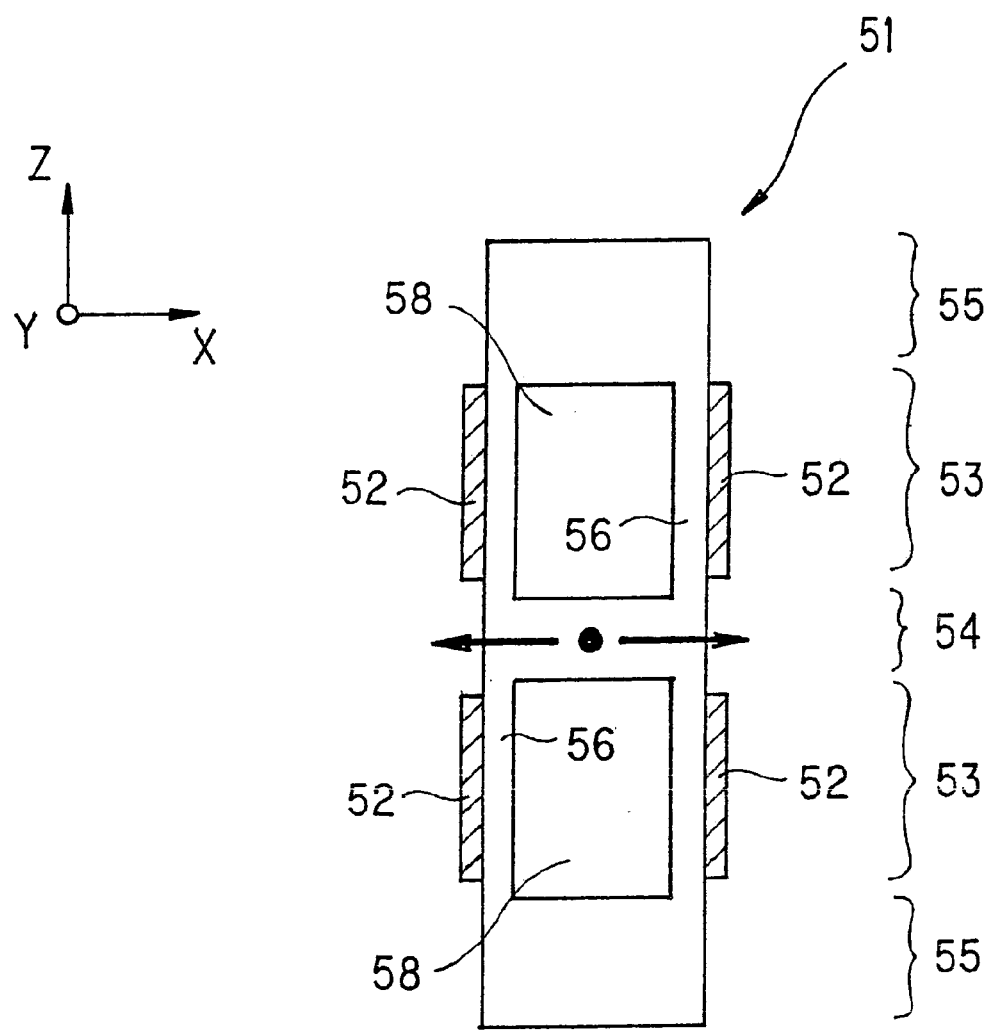
FIG. 7 is a schematic explanatory drawing showing still another embodiment of a piezoelectric/electrostrictive device of the present invention.

Moreover, in the case where there are two or more driving portions, it is not always necessary that the movable portion and the fixed portion exist at both ends of the device, and as shown in FIG. 7, it is also possible that the fixed portions 55 are arranged at both ends and the movable portion 54 is arranged between the fixed portions 55—55.

In such a constitution, since the device 51 can surely be fixed though the travel of the movable portion is decreased, there are advantages that the improvement of mechanical strength and impact resistance can be attained and that the operation in the YZ plane (operation in the so-called flapping direction) can be restrained.

Figure 8:
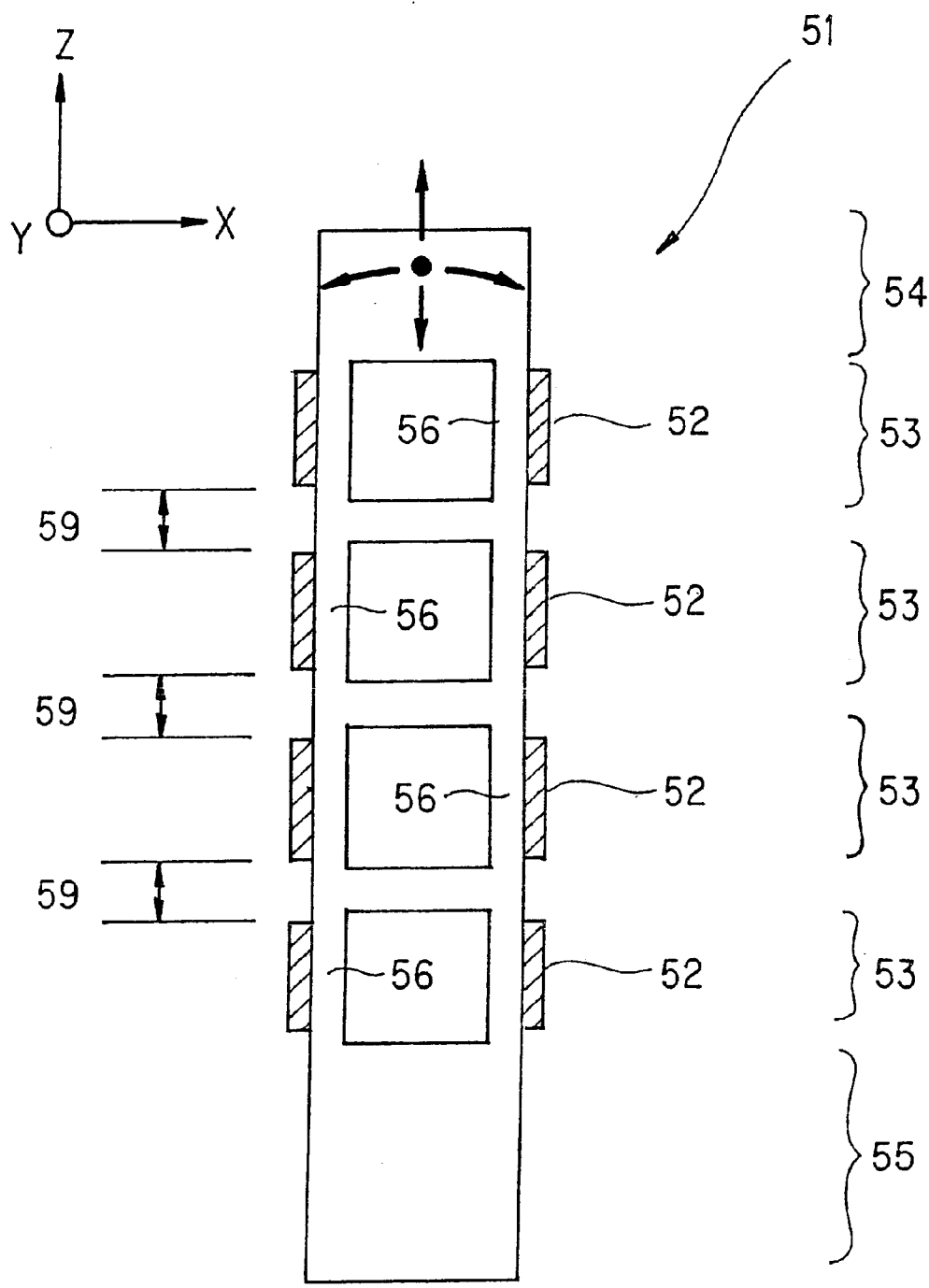
FIG. 8 is a schematic explanatory drawing showing still another embodiment of a piezoelectric/electrostrictive device of the present invention.

As mentioned above, in case of providing a plurality of driving portions, it is preferable to make the gap portion 59 between the respective driving portions 53—53 shorter than the fixed portion 55 or the movable portion 54 as shown in FIG. 8. The reason is that the travel becomes larger.

Figure 9:
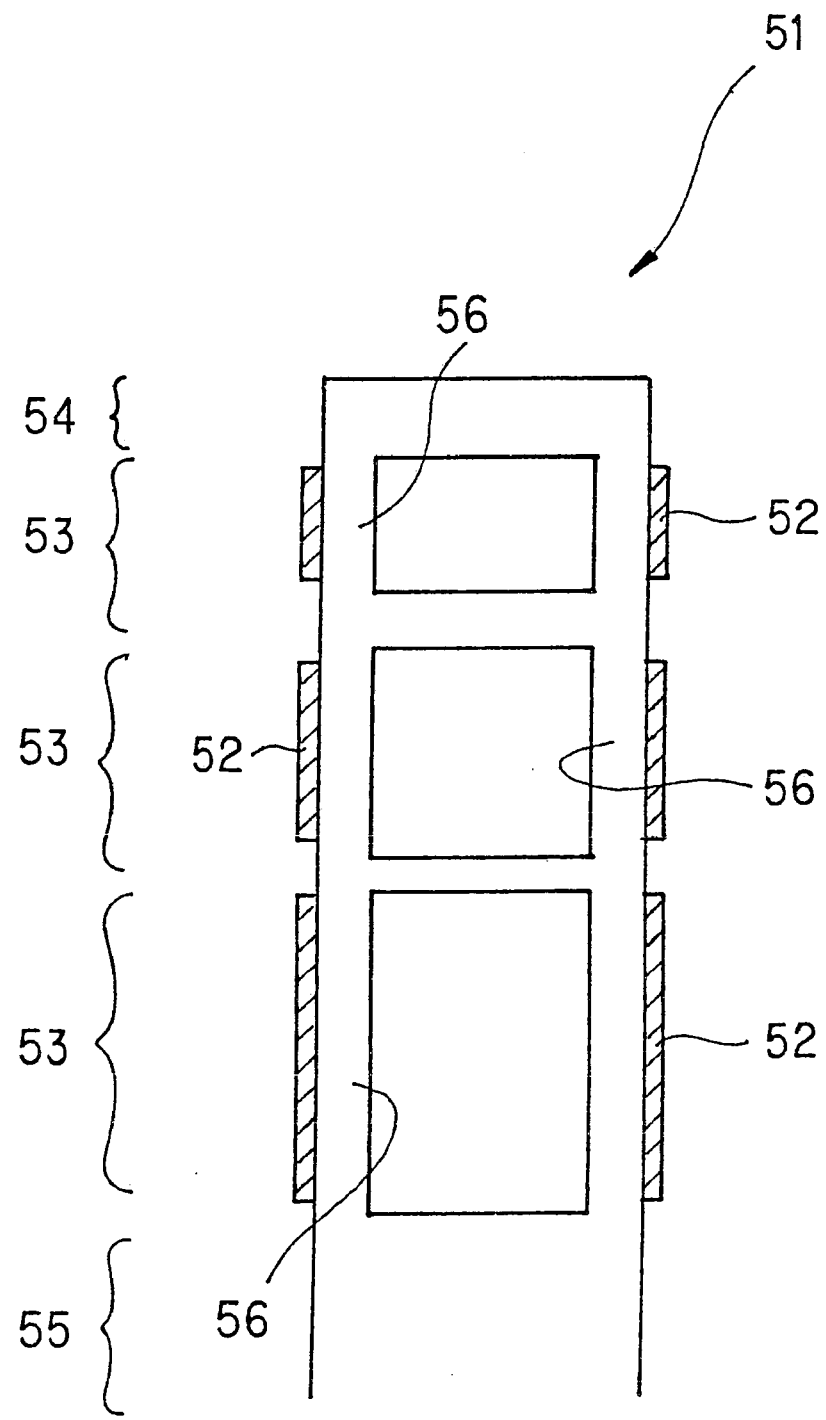
FIG. 9 is a schematic explanatory drawing showing still another embodiment of a piezoelectric/electrostrictive device of the present invention.

Furthermore, it is also possible to make the lengths of the respective driving portions 53 shorter as they approach the movable portion 54 as shown in FIG. 9. Such a constitution is preferable in that the movable portion can largely be operated and that a delicate adjustment is also possible since a fine control of the driving amount is possible at a part where the driving portion 53 is short while ensuring the driving amount at a part where the driving portion 53 is long.

Figure 10:
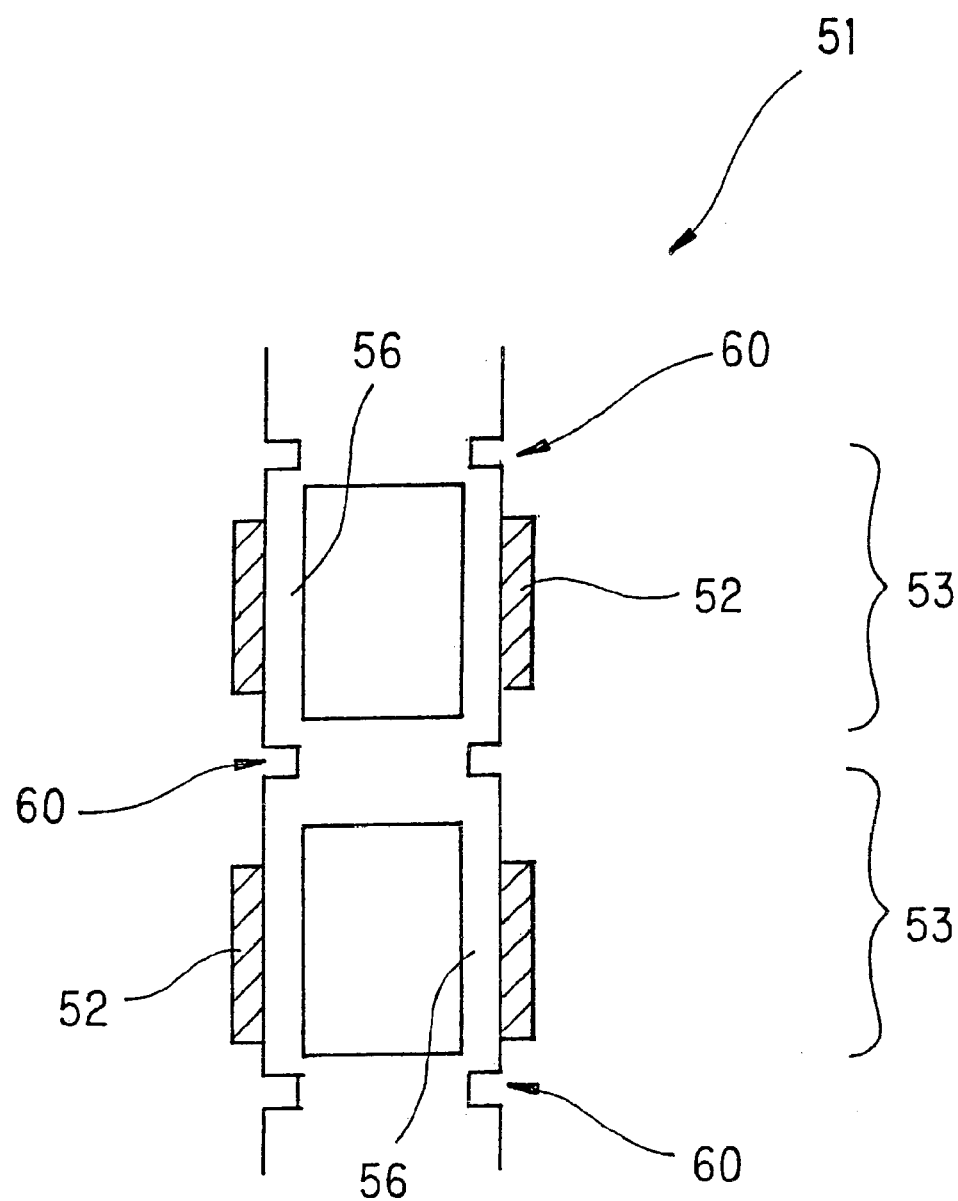
FIG. 10 is a schematic explanatory drawing showing still another embodiment of a piezoelectric/electrostrictive device of the present invention.

Furthermore, a device in which a notch portion 60 is formed between the respective driving portions 53—53 as shown in FIG. 10 is also preferable, though there is also a balance with mechanical strength. The reason is that a thin plate 56 may easily be bent at the notch portion 60, so that the travel of the movable portion can be increased.

Moreover, the device of the present invention has an advantage that component materials can properly be selected according to the required characteristics of the respective members as for the members except for a piezoelectric/electrostrictive element since it is not always necessary for the total to be constituted by a piezoelectric/electrostrictive material, in addition to the above effects. That is, by making the members except for a piezoelectric/electrostrictive element of a light weight material, to make it difficult to be affected by a harmful vibration in operation is possible, and it is also easy to improve mechanical strength, handling efficiency, impact resistance, and moisture resistance in a similar manner.

Furthermore, since it is unnecessary to use a filler, the efficiency of displacement based on the inverse piezoelectric effect or electrostrictive effect is not lowered.

2. Components of Device

Next, the respective elements constituting a device of the present invention will separately and specifically be described by using an example of the device 1 shown in FIG. 1.

(1) Movable Portion and Fixed Portion

The movable portion 4 is a part which operates on the basis of a driving amount of the driving portion 3, to which various members are attached according to the service objectives of the device 1. For example, in case of using the device 1 as a displacement element, it is sufficient to attach a member which requires a positional adjustment such as a shielding plate of a light shutter or a magnetic head.

The fixed portion 5 is a part which supports the driving portion 3 and the movable portion 4, and the total of the device 1 is fastened by supportably fastening the fixed portion 5 to a certain substance.

Furthermore, in some cases, a member such as an electrode wire for controlling the piezoelectric element 2 is arranged.

Materials for the movable portion 4 and the fixed portion 5 are not especially limited as long as they have rigidity, but it is preferable to use ceramic to which the green sheet laminating method to be described later can be applied. Specifically, zirconia covering stabilized zirconia and partially stabilized zirconia, alumina, magnesia, silicon nitride or the like can be cited, and zirconia, especially stabilized zirconia and partially stabilized zirconia are preferable in that they have high mechanical strength and high toughness.

(2) Driving Portion

The driving portion 3 is a part which is driven by displacement of the piezoelectric element 2, and it is constituted by facing thin plates 6, 7 and a thin film piezoelectric element 2 formed on the surface the thin plate 6.

(i) Thin Plate

The thin plates 6, 7 are thin plate members with flexibility, and have function to amplify expanding and contracting displacement of the piezoelectric element 2 provided on the surface as bending displacement and to transmit the displacement to the movable portion 4.

Accordingly, it is sufficient that the thin plates 6, 7 have flexibility and have mechanical strength of a degree which is not broken by the bending deformation, and they can properly be selected by considering responsibility and operability of the movable portion.

Usually, the thickness of the thin plates 6, 7 is preferably about 5 to 100 $\mu$m, and the total thickness of the thin plates 6, 7 and the piezoelectric element 2 is preferably 10 to 500 pm. Furthermore, the width of the thin plates 6, 7 is preferably 30 to 500 pm, and it is preferably 5 or more times the thickness of the thin plates 6, 7, and it is more preferably 8 or more times, from the view point of restraining displacement in the YZ plane, that is, a flapping component and of effectively generating displacement in the XZ plane.

As a material for forming the thin plates 6, 7, ceramic similar to that for the movable portion 4 and the fixed portion 5 can preferably be used, and zirconia, especially stabilized zirconia and partially stabilized zirconia can most preferably be employed since they have a large mechanical strength even if they are shaped like a thin plate, and have high toughness and low reactivity with a piezoelectric film or an electrode material.

In case of using stabilized zirconia or partially stabilized zirconia as a material of the thin plates 6, 7, it is preferable to contain an additive such as alumina or titania from the view point of being capable of relieving the residual stress when sintering the piezoelectric film.

(ii) Piezoelectric Element

Figure 11:
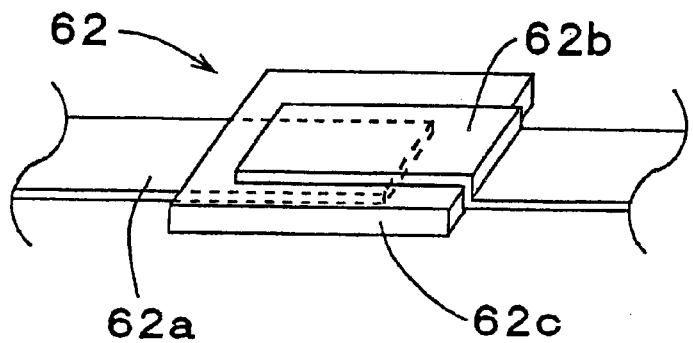
FIG. 11 is a schematic perspective illustration showing one embodiment of a piezoelectric element constituting a piezoelectric/electro-strictive device of the resent invention.

The piezoelectric element 2 is constituted by a piezoelectric film and an electrode for applying voltage to the piezoelectric film, and it is possible to use a conventionally known piezoelectric element such as a unimorph-type or a bimorphtype. For example, as shown in FIG. 11, it is possible to preferably use a layeredtype piezoelectric element 62 in which a lower electrode 62c, a piezoelectric film 62a, and an upper electrode 62b are laminated, or the like.

Figure 13:
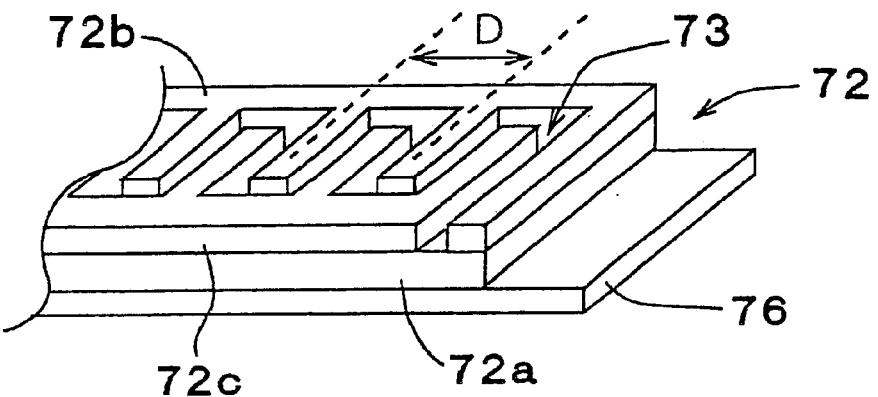
FIG. 13 is a schematic perspective illustration showing another embodiment of a piezoelectric element constituting a piezoelectric/electro-strictive device of the present invention.

Furthermore, it is also possible to use such a piezoelectric element 72 as shown in FIG. 13, which is constituted by a first electrode 72b and a second electrode 72c with a comb-type structure, and which has a structure where the first electrode 72b and the second electrode 72c are mutually engaged with a gap portion 73 of a constant width between the mutual comb tooth portions. In FIG. 13, the first electrode 72b and the second electrode 72c are arranged above the thin plate 76 and the piezoelectric film 72a, but it is also possible to form the electrodes between the thin film 76 and the piezoelectric film 72a.

Figure 14:
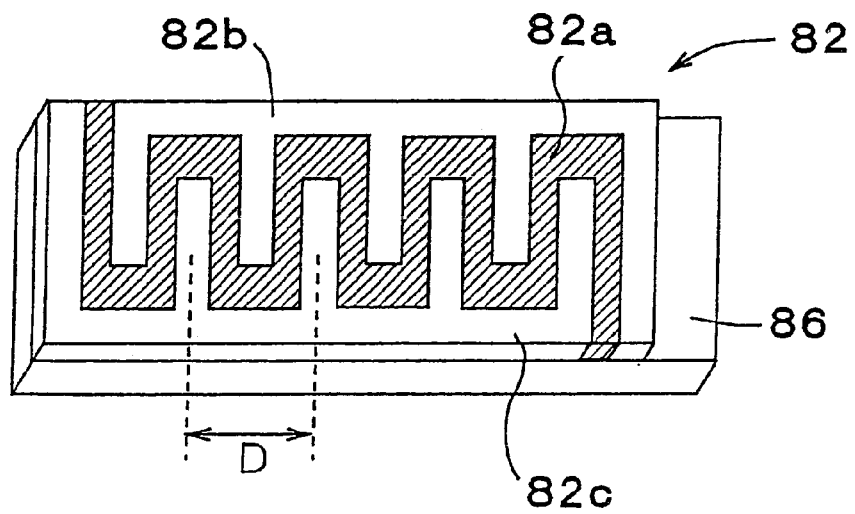
FIG. 14 is a schematic perspective illustration showing still another embodiment of a piezoelectric element constituting a piezoelectric/electro-strictive device of the present invention.

Furthermore, a piezoelectric element 82 shown in FIG. 14 is also constituted by a first electrode 82b and a second electrode 82c with a comb-type structure, and it has a structure in which the first electrode 82b and the second electrode 82c are mutually engaged with a gap portion 83 of a constant width between the mutual comb tooth portions.

The piezoelectric element 82 is constituted so that the piezoelectric film 82a may be embedded in the gap portion between the first electrode 82b and the second electrode 82c, and a piezoelectric element like this can also preferably be used for a device of the present invention. In case of using a piezoelectric element having a comb-shaped electrode like the piezoelectric elements 72, 82, it is possible to enlarge displacement of a piezoelectric element by decreasing a pitch D of the comb teeth.

By the way, it is preferable to form the piezoelectric element 2 on the outside of the device 1 like the device 1 shown in FIG. 1 from the view point of increasing displacement of the driving portion, but it is also possible to form that on the inside (that is, in the hole portion) of the device 1, and it is also possible to form them both on the inside and outside of the device 1.

As a piezoelectric film, piezoelectric ceramic is preferably used, but it is also possible to use electrostrictive ceramic, ferroelectric ceramic, or antiferroelectric ceramic. However, in case of being used for a magnetic head or the like, the linearity between the travel of the movable portion and the applying voltage or output voltage is important, and therefore, it is preferable to use a material with a small strain hysteresis, and it is preferable to use a material with a coercive electric field of 10 or less kV/mm.

As specific piezoelectric ceramics, it is possible to cite the ceramics which contain the following substances as an independent substance or a mixture: lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, strontium bismuth tantalate or the like. Especially, it is preferable to use a material whose main component is lead zirconate, lead titanate, and lead magnesium niobate, or a material whose main component is sodium bismuth titanate, from the view point of being capable of obtaining a material which has a high electromechanical coupling factor and piezoelectric constant, and has a small reactivity with the thin plate (ceramic) when sintering the piezoelectric film, and has a stable composition.

Furthermore, it is also possible to use the ceramics which contain oxides or the like of the following substances as an independent substance or a mixture in addition to the above piezoelectric ceramics: lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin or the like. For example, in some case, it is possible to obtain advantages that the coercive electric field and piezoelectric characteristics or the like can be adjusted, by making zirconate, titanate, and magnesium niobate, which are main components, contain lanthanum or strontium.

An electrode of the piezoelectric element is preferably made of a metal which is solid at room temperature and is excellent in conductivity, and for example, a simple metal or an alloy of the following substances is used: aluminum, titanium, chromium, iron, cobalt, nickel, copper, zinc, niobium, molybdenum, ruthenium, palladium, rhodium, silver, tin, tantalum, tungsten, iridium, platinum, gold, wire or the like, and further, it is also possible to use a cermet material in which the same material as that of the piezoelectric film or thin plate is scattered in these.

The selection of a material for an electrode in the piezoelectric element is determined depending on the forming method of a piezoelectric film. For example, in case of forming a piezoelectric film by sintering on a first electrode after forming the first electrode on a thin plate, it is necessary to use a metal with a high melting point such as platinum which does not change at the sintering temperature of the piezoelectric film, for the first electrode, but for the second electrode formed on a piezoelectric film after forming the piezoelectric film, a metal with a low melting point such as aluminum can be used, since the electrode can be formed at a low temperature.

Figure 15:
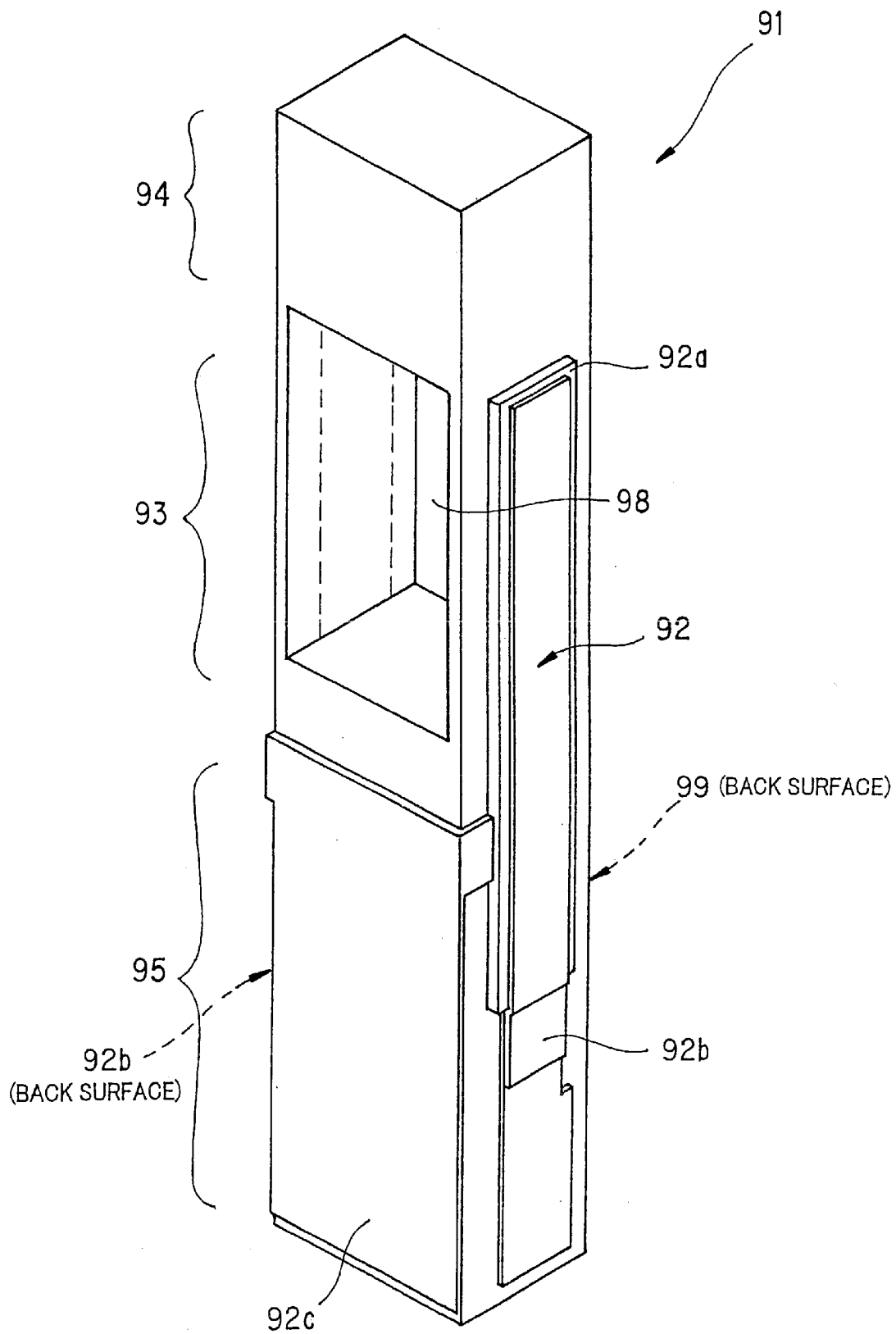
FIG. 15 is a schematic perspective illustration showing one embodiment of the arranging method of an electrode wire of a piezo-electric/electrostrictive device of the present invention.

Various modes of electrode wires from the piezoelectric element can be considered, and for example, as shown in FIG. 15, in a device 91 in which piezoelectric elements 92 are formed on both facing thin plates 96, a mode can be cited, in which lower electrodes 92c of two piezoelectric elements 92 are common and are pulled out to the side of one surface of the fixed portion 95 where a hole portion 98 is open, and upper electrodes 92b are directly pulled out to the side of the surface of the fixed portion 95 where each piezoelectric element 92 is formed.

A mode like this is preferable in that the device can be fixed with high reliability and it can be made compact, since no electrode is formed at a part (99 in the figure) on the side of other surface of the fixed portion 95 where a hole portion 98 is open so that the device can be fixed by using that part.

Furthermore, it is also possible to be a mode where both the upper electrode 92b and the lower electrode 92c are pulled out to the side of the surface of the fixed portion 95 where the respective piezoelectric elements 92 are formed so that the electrodes 92b, 92c may be in parallel as shown in FIG. 16 (*a*), or a mode where both the upper electrode 92b and the lower electrode 92c are separately pulled out to the side of the surface of the movable portion 94 and the side of the surface of the fixed portion 95 where each piezoelectric element 92 is formed.

3. Manufacturing Method of Device

Here, a manufacturing method of a device of the present invention will be described.

In a device of the present invention, it is preferable that a material for the respective members is ceramics and the device is manufactured by using the green sheet laminating method. The reason is that the reliability of the joint portions of the respective members can be improved by using the green sheet laminating method capable of integrally forming a device, and in addition to that, it is possible to mass-produce devices with the above excellent characteristics by simplifying the manufacturing process.

(1) Manufacturing of Layered Body

First, a binder, a solvent, a dispersant or the like is added to and mixed with a ceramic powder such as zirconia to prepare slurry, and after the slurry is subjected to degassing treatment, a green sheet having a specified thickness is produced by a method such as the reverse roll coater method or the doctor blade method.

Figure 17A:
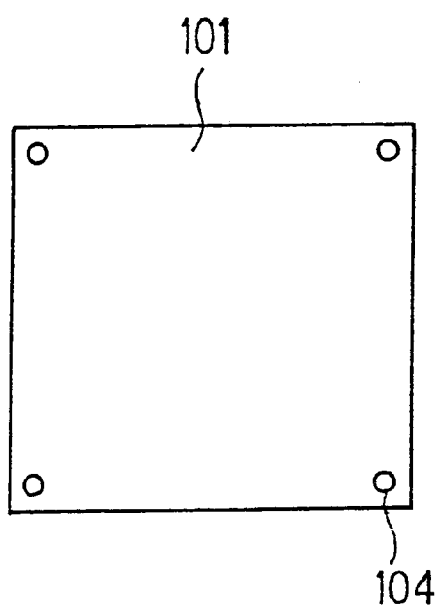
FIG. 17 (a) and (b) are schematic explanatory drawings showing examples of green sheets used in the manufacturing of a piezoelectric/electrostrictive device of the present invention.
Figure 17B:
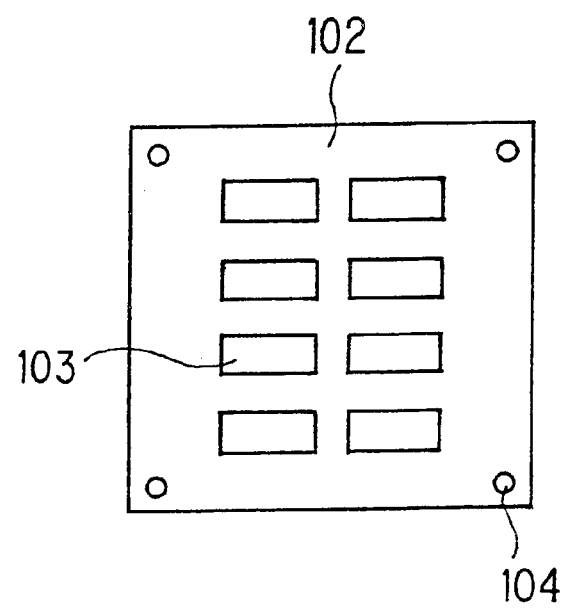
Figure 19A:
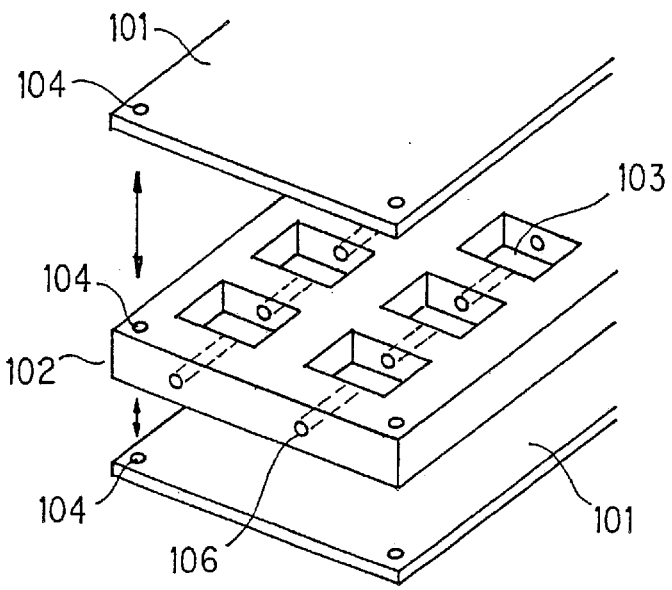
FIGS. 19 (a) to (d) are process drawings showing an embodiment of a manufacturing method of a piezoelectric/electrostrictive device of the present invention.
Figure 19B:
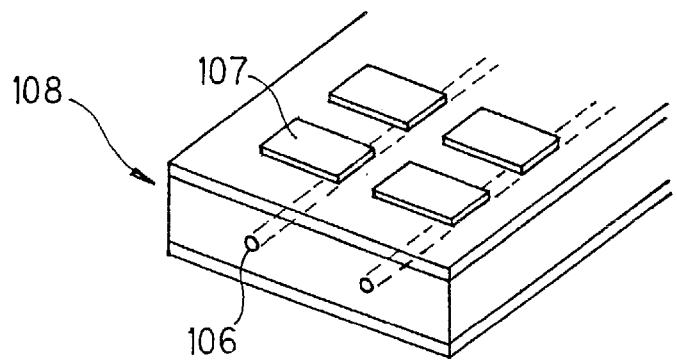
Figure 19C:
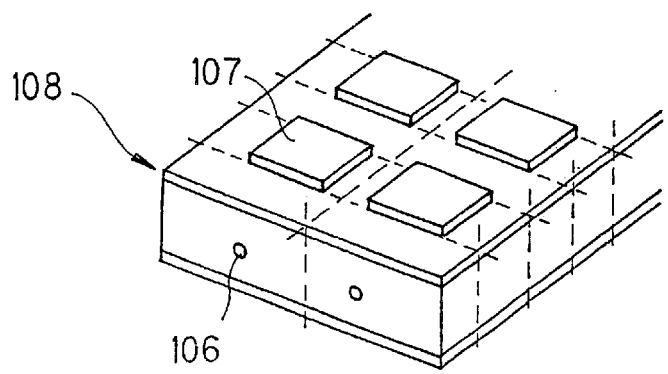
Figure 19D:
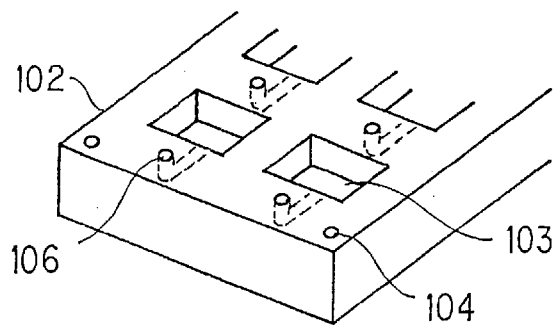

Next, the green sheet is processed to have various shapes shown in FIGS. 17 (*a*) and (*b*) by a method such as the punching method using a mold.

A green sheet 101 is a green sheet to be mainly a thin plate after the sintering, and a green sheet 102 where at least one hole portion having a rectangular-like shape 103 is formed is a member to be a movable portion and a fixed portion. It is possible to obtain a plurality of devices at a time, or to obtain at least a device with a plurality of movable portions by forming one or more lines of hole portions 103 in parallel.

A thickness required for a thin plate, a movable portion, and a fixed portion can be obtained by laminating at least one green sheet 101 and at least one green sheet 102.

A layered body can be obtained in such a way where the green sheets are laminated in the order of a green sheet 101, a green sheet 102, and a green sheet 101 while performing the positioning by using a reference hole 104 and they are integrated by using a method such as the thermocompression bonding (FIG. 19 (a)).

When there is a situation in which the green sheet 102 is thick and the forming of the hole portion 103 is difficult or the like, it is also possible to obtain a final layered body 108 by forming the upper and lower parts of the layered body 105 and then joining the upper and lower parts to obtain the layered body 108 such that the hole portions 103 face each other as shown in FIG. 18.

As for the layered body 108, it is necessary to form in advance a connecting hole 106 between a part to be the hole portion 103 of the green sheet 102 and the outer space in the green sheet 102, or to bore the connecting hole 106 after obtaining the layered body.

However, the shape of the connecting hole 106 is not especially limited as long as each hole portion 103 is connected to the outer space, and it is also possible to be a shape of separately connecting each hole portion 103 to the outer space as shown in FIG. 19 (d) besides a shape of penetrating a plurality of hole portions 103 as shown in FIGS. 19 (a) and (b).

(2) Formation of Piezoelectric/Electrostrictive Element

In the manufacturing method of the present invention, it is possible to form a piezoelectric element 107 on the surface of a green sheet 101 to be a thin plate by a thick film method such as the screen printing, dipping, painting, or electrophoresis method, or by a thin film method such as the ion beam method, sputtering, vacuum evaporation, ion plating, chemical vapor deposition (CVD), or plating (FIG. 19 (b)).

By forming a piezoelectric element by a film forming method like this, a piezoelectric element and a thin plate can be integrally bonded and arranged without using adhesives, and the reliability and repeatability are ensured, which makes the integration easy.

However, in the manufacturing method of the present invention, it is preferable to form a piezoelectric element 107 by thick film methods. The reason is that these methods make it possible to form a piezoelectric film by using paste and slurry, or suspension and emulsion, sol or the like whose main component is piezoelectric ceramic particles having an average particle diameter of 0.01 to 5 μm, preferably of 0.05 to 3 μm and a preferable piezoelectric operating characteristics can be obtained. Particularly, the electrophoresis method has an advantage that a film can be formed at a high density and with a high shape accuracy.

Specifically, after sintering a layered body under a predetermined condition, a lower electrode is printed and sintered at a predetermined position on the surface of the sintered green sheet 101, and next, a piezoelectric film is printed and sintered, and further, an upper electrode is printed and sintered, so that a piezoelectric element can be formed (FIG. 19 (b)). Furthermore, an electrode wire for connecting the electrode to a driving circuit should be printed and sintered.

Here, when materials are selected so that the sintering temper-atures of the respective members may sequentially be lower by using platinum (Pt) as the lower electrode, lead zirconate titanate (PZT) as the piezoelectric film, gold (Au) as the upper electrode, and silver (Ag) as the electrode wire, the re-sintering of a material sintered before that moment does not occur in a certain sintering stage, and it is possible to avoid the occurrence of trouble such as exfoliation or aggregation of electrode materials or the like.

By selecting a proper material, it is possible to sequentially print the respective members and electrode wires of a piezoelectric element 107 and to integrally fire them at a time, and on the other hand, it is also possible to provide the respective electrodes or the like at a low temperature after forming a piezoelectric film.

Furthermore, it is also possible to form the respective members and electrode wires of the piezoelectric element by a thin film method such as sputtering or vapor evaporation, and in this case, the heat treatment is not always necessary.

It is also preferable that a piezoelectric element 107 is formed in advance at position finally to be a thin plate of a green sheet 101 and is sintered simultaneously with a layered body 108. As a method of sintering a piezoelectric element 107 and a layered body 108 at the same time, a method can be cited, where a piezoelectric film is formed by press molding using a mold, tape molding using a slurry material or the like and this piezoelectric film before sintering is laminated on a green sheet 101 by thermocompression bonding and they are simultaneously sintered to produce a movable portion, a driving portion, a thin plate, and a piezoelectric film at the same time. However, when this method is used, it is necessary to form in advance an electrode on a thin plate or a piezoelectric film by using the above film forming method.

The sintering temperature of a piezoelectric film is properly determined on the basis of a material forming this, and usually, it is 800° C.to 1400° C., and preferably, it is 1000° C. to 1400° C. In this case, in order to control a composition of a piezoelectric film, it is preferable to perform the sintering in the presence of an evaporation source of a material of a piezoelectric film. In case of sintering a piezoelectric film and a layered body 108 at the same time, it is necessary to unify the sintering conditions of both.

In case of manufacturing a device in which piezoelectric elements are formed on both facing thin plates, piezoelectric films, electrodes or the like should be printed on both surfaces of a layered body.

In such a case, it is necessary to take an action for preventing the printed piezoelectric film, electrode or the like from adhering to the printing stage by a method <1>of performing the printing on a printing stage where a concave portion is provided in the stage, or a method <2>of performing the printing of the other surface, after forming a frame-like convex portion around the printing part on at least one printing surface of the layered body and performing the printing of the surface having the convex portion formed, or the like.

(3) Sintering and Cutting of Layered Body

In the above layered body, a plurality of devices can be obtained at the same time in such a way where the formation of a notch portion and the treatment of coating and shielding of a piezoelectric element and an electrode wire are performed if necessary, and after that, the sintering is performed at a temperature of 1200° C. to 1600° C., and the cutting is performed in the laminating direction of the green sheet so that the hole portion having a rectangular-like shape 103 may be open on the side of the layered body (FIG. 19 (c)). As a cutting method, it is possible to apply a laser beam machining using a YAG laser beam, an eximer laser beam or the like, and an electron beam machining in addition to a dicing machining, a wire saw machining or the like (mechanical machining).

In the manufacturing method of the present invention, the cutting is performed so that the hole portion having a rectangular-like shape 103 may be open on the side of the layered body 103.

Such a cutting has an advantage that not only a plurality of devices can be separated but also thin plates and a hole portion of a device (thin plates 6, 7 and a hole portion 8 in the device 1 in FIG. 1) can be formed at a time, and it is preferable in that it is possible to easily obtain a complex structure in which two or more rectangular parallelepipeds are connected by thin plates and which cannot easily be manufactured.

Furthermore, by properly changing the number of formations and the position of formation of the hole portions 103 in the green sheet 102, or the cutting position of the layered body 108, it is also possible to easily form a device having a plurality of driving portions (FIGS. 6 to 8) and a device having different lengths of driving portions (FIG. 9).

A device of the present invention can also be produced by press molding using a molding die, slip casting, injection molding or the like in addition to the above producing method using a green sheet. Furthermore, a producing method of joining the respective component members prepared as different bodies is also possible, but it has a problem from the view point of reliability since damages or the like easily occur in the junctions, in addition to low productivity.

4. Examples of Application of Device

Finally, as one example of the applications of a device of the present invention, an example in which a device of the present invention is applied to displacement element for a light shutter will be described. "Light shutter" expressed in the present specification means a functional element which controls penetration and shielding of light by relatively displacing two shielding plates, and since it can perform ON/OFF control of light and light volume control, it can function as a light switch or a light aperture.

A light shutter of the present invention is a shutter in which at least one shielding plate of two shielding plates is attached to a movable portion of a device of the present invention.

Figure 20A:
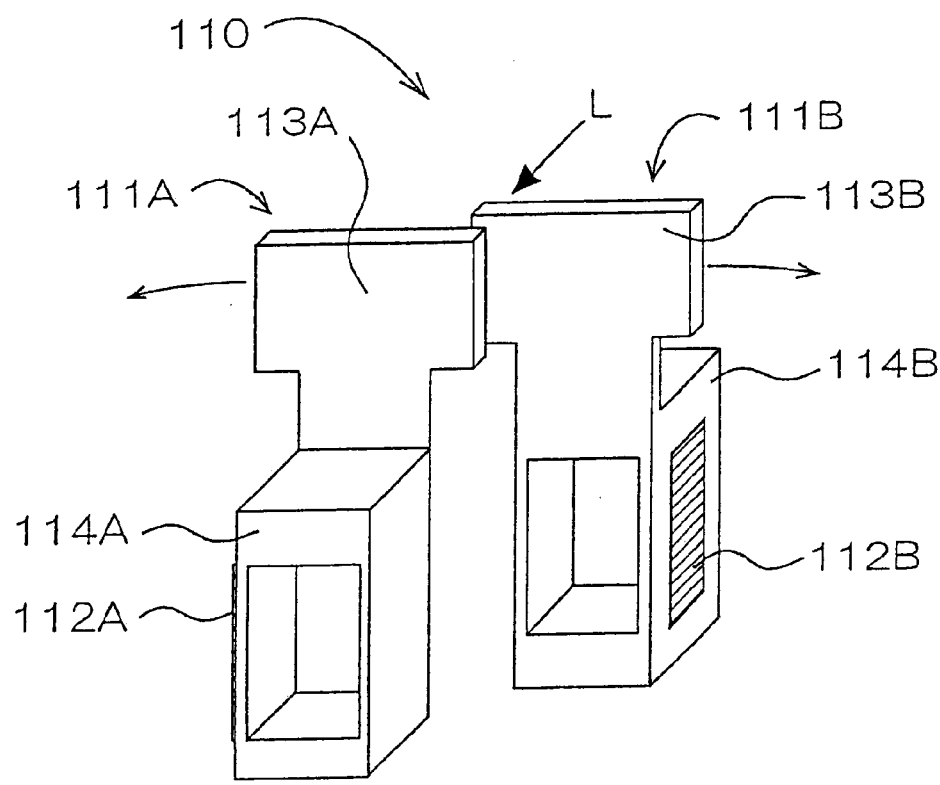
FIGS. 20 (a) and (b) are schematic explanatory drawings showing an embodiment of a light shutter of the present invention, and FIG. 20 (a) is an illustration and FIG. 20 (b) is a top view.
Figure 20B:
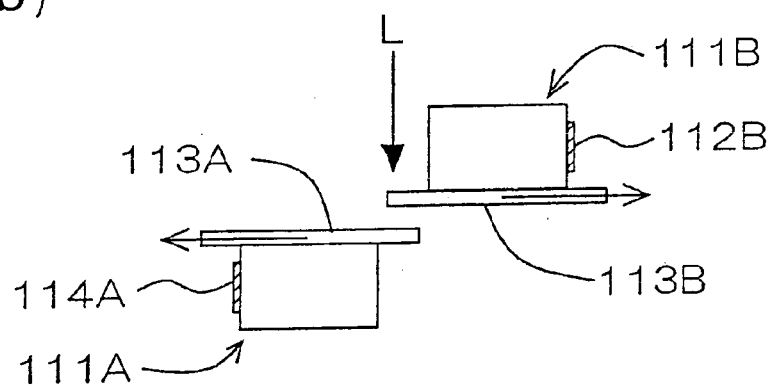

For example, a light shutter 110 shown in FIGS. 20 (*a*), (*b*) is made of two units 111 A, 111 B equipped with devices of the present invention and shielding plates, and two shielding plates 113A, 113B are respectively attached to movable portions 114A, 114B of the devices, and they are arranged so that the mutual plate surfaces may be in parallel and parts of the plate faces may overlap with each other in the incident direction of the light L.

The light shutter 110 shields the light L in the illustrated state, but by applying voltage of the same phase to piezoelectric elements 112A, 112B formed on the driving portions of the devices, the shielding plate 113A displaces to the left side of the figure and the shielding plate 113B displaces to the right side of the figure, and therefore, the overlapping condition of the shielding plates 113A, 113B changes, so that ON/OFF control of light and light volume control can be performed.

Furthermore, a light shutter 120 shown in FIG. 21 (*a*) is made of two units 121, 122 equipped with devices and shielding plates of the present invention, and two shielding plates 123A, 123B are respectively attached to movable portions 124A, 124B of the devices, and they are arranged so that the mutual plate surfaces may be in parallel and the plate faces may entirely overlap with each other in the incident direction of the light L. Then, in the shielding plates 123A, 123B, slits 125A, 125B are formed at the facing positions, respectively.

The light shutter 120 passes the light L through the slits 125A, 125B in the state of FIGS. 21 (*a*), (*b*), but by applying voltage of the same phase to piezoelectric elements 122A, 122B formed on the driving portions of the devices, the shielding plate 123A displaces to the left side of the figure and the shielding plate 123B displaces to the right side of the figure, and therefore, the overlapping condition of the slits 125A, 125B changes, so that ON/OFF control of light and light volume control can be performed. In the FIG. 21 (*c*), a state where a part of the light penetrates is shown, but it is also possible to completely shield the light L by changing the shapes and forming positions of the slits 123A, 123B.

In contrast with this, it is also possible that to constitute a light shutter so that the slits 125A, 125B may not overlap with each other and the light L may be shielded in the state of FIGS. 21 (*a*), (*b*), and so that the slits 125A, 125B may overlap with each other by the displacing of the shielding plates 123A, 123B and the light L may be passed.

In examples of FIGS. 20 (*a*), (*b*) and FIGS. 21 (*a*), (*b*), (*c*), the example where two shielding plates are attached to the devices respectively, but in a light shutter of the present invention, it is also possible to control the penetration and shielding of the light in such a way in which at least a shielding plate on one side is attached to the device and the shielding plate on one side is merely displaced. However, a way of attaching both shielding plates to the devices is preferable in that the relative travel of the shielding plates can be increased.

Furthermore, in examples of FIGS. 20 (*a*), (*b*) and FIGS. 21 (*a*), (*b*), (*c*), the light shutter is constituted by two units, but it may be constituted with three or more units. In this case, it can also be used as a light aperture of changing the degree of opening of the overlapping parts or the like by variously setting the displacing directions of a plurality of shielding plates.

In a light shutter of the present invention, since a shielding plate is attached to a movable portion of the device of the present invention, the operation in the flapping direction of the shielding plate is restrained. That is, since the shielding plate displaces while facing in the incident direction of the light at all times, it can preferably be used since the ON/OFF control of light and light volume control can more accurately be performed.

As described above, a piezoelectric/electrostrictive device of the present invention can largely displace a movable portion, and it is not easily affected by a harmful vibration in operation, and it is excellent in mechanical strength, handling efficiency, impact resistance, and moisture resistance.

Furthermore, there is an advantage that it can be produced at a low cost while raising reliability by having an integrated structure, by using a simple manufacturing method such as the green sheet laminating method.

Accordingly, it can be used as a sensor element for various kinds of sensors such as an ultrasonic sensor or an acceleration sensor, an angular speed sensor, an impact sensor, or a mass sensor, besides an active element such as various kinds of transducers, various kinds of actuators, frequency-region functional parts (filter), transformers, oscillators or resonators for communication or motive power, vibrators, or discriminators, and especially, it is preferably used for various kinds of actuators used in a mechanism of the displacement, positioning adjustment, or the angular adjustment of various kinds of precision parts or the like of optical machinery and tools, precision machinery and tools or the like.

What is claimed is:

1. A piezoelectric/electrostrictive device comprising:
   a driving portion which is driven by displacement of a piezoelectric/electrostrictive element;
   a movable portion which operates on the basis of a drive of the driving portion; and a fixed portion for supporting said driving portion and said movable portion, wherein the driving portion includes thin plates having major surfaces facing each other and a thin film piezoelectric/electrostrictive element formed on a surface of at least one of the thin plates, and said fixed portion and said movable portion are connected by the driving portion.

2. The piezoelectric/electrostrictive device according to claim 1, wherein the movable portion and the fixed portion are shaped like a rectangular parallelepiped, and the thin plates facing each other are spanned so that sides of said movable portion and said fixed portion are continuous.

3. The piezoelectric/electrostrictive device according to claim 1, wherein the driving portion is driven in a direction perpendicular to the direction of displacement of the piezoelectric/electrostrictive element.

4. The piezoelectric/electrostrictive device according to claim 3, wherein the movable portion operates in a plane including the driving direction of the driving portion.

5. The piezoelectric/electrostrictive device according to claim 1, wherein a piezoelectric/electrostrictive element is formed on each thin plate, and one of the piezoelectric/electrostrictive elements drives the driving portion while the other piezoelectric/electrostrictive element is used for detection of displacement of the movable portion.

6. The piezoelectric/electrostrictive device according to claim 1, wherein the device has at least two driving portions.

7. The piezoelectric/electrostrictive device according to claim 1, wherein the width of each thin plate is 5 or more times the thickness of the thin plate.

8. The piezoelectric/electrostrictive device according to claim 1, wherein the piezoelectric/electrostrictive element is a layered type piezoelectric/electrostrictive element in which a lower electrode, a piezoelectric/electrostrictive film, and an upper electrode are laminated.

9. The piezoelectric/electrostrictive device according to claim 1, wherein the piezoelectric/electrostrictive element includes a piezo-electric/electrostrictive film, and first and second electrodes having a comb-like structure, and which has a structure where the first electrode and second electrode are mutually engaged with a gap portion of a constant width between mutual comb tooth portions.

10. The piezoelectric/electrostrictive device according to claim 1, wherein the movable portion, the thinplates, and the fixed portion are made of an integrally formed ceramic.

11. The piezoelectric/electrostrictive device according to claim 10, wherein the movable portion, the thin plates, and the fixed portion are made of completely stabilized zirconia or partially stabilized zirconia.

12. The piezoelectric/electrostrictive device according to claim 10, wherein at least the movable portion, the thin plates, and the fixed portion are constituted by green sheet layered bodies.

13. The piezoelectric/electrostrictive device according to claim 1, wherein a piezoelectric/electrostrictive film constituting the piezoelectric/electrostrictive element is made of a material containing lead zirconate, lead titanate, and lead magnesium niobate as main components.

14. The piezoelectric/electrostrictive device according to claim 1, wherein a piezoelectric/electrostrictive film constituting the piezoelectric/electrostrictive element includes a material containing bismuth sodium titanate as a main component.

15. A light shutter for controlling penetration and shielding of light by relatively displacing two shielding plates, comprising:

a piezoelectric/electrostrictive device which comprises:

a driving portion driven by displacement of a piezoelectric/electrostrictive element;

a movable portion operating on the basis of a drive of the driving portion;

a fixed portion for supporting said driving portion and said movable portion, wherein the driving portion includes thin plates having major surfaces facing each other and a thin film piezoelectric/electrostrictive element formed on a surface of at least one of the thin plates, and said fixed portion and said movable portion are connected by the driving portion; and at least one shielding plate attached to the movable portion of the piezoelectric/electrostrictive device.

* * * * *

UNITED STATES PATENT AND TRADEMARK OFFICE
CERTIFICATE OF CORRECTION

PATENT NO.    : 6,329,740 B1
DATED         : December 11, 2001
INVENTOR(S)   : Toshikazu Hirota, Koji Kimura and Yukihisa Takeuchi It is certified that error appears in the above-identified patent and that said Letters Patent is hereby corrected as shown below:

<u>Title page,</u>
Item [30], insert -- Foreign Application Priority Data
               October 1, 1999  (JP)................11-281522 --

Signed and Sealed this

Twenty-third Day of July, 2002

Attest:

Attesting Officer

JAMES E. ROGAN
Director of the United States Patent and Trademark Office